(12) United States Patent
Rath et al.

(10) Patent No.: US 11,977,525 B2
(45) Date of Patent: May 7, 2024

(54) METHOD TO OPTIMIZE INGEST IN DEDUPE SYSTEMS BY USING COMPRESSIBILITY HINTS

(71) Applicant: EMC IP Holding Company LLC, Hopkinton, MA (US)

(72) Inventors: Jagannathdas Rath, Bengaluru (IN); Kalyan C. Gunda, Bengaluru (IN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 43 days.

(21) Appl. No.: 17/192,544

(22) Filed: Mar. 4, 2021

(65) Prior Publication Data

US 2022/0283998 A1    Sep. 8, 2022

(51) Int. Cl.
*G06F 16/215*    (2019.01)
*G06F 16/174*    (2019.01)
*H03M 7/30*    (2006.01)

(52) U.S. Cl.
CPC ........ *G06F 16/215* (2019.01); *G06F 16/1744* (2019.01); *H03M 7/30* (2013.01)

(58) Field of Classification Search
CPC ......................... G06F 16/215; G06F 2212/401
See application file for complete search history.

(56) References Cited

U.S. PATENT DOCUMENTS

| | | | |
|---|---|---|---|
| 2004/0030847 A1* | 2/2004 | Tremaine | G06F 12/08 711/158 |
| 2009/0112949 A1* | 4/2009 | Ergan | G06F 12/0802 |
| 2011/0285559 A1* | 11/2011 | Fallon | H03M 7/40 341/87 |
| 2014/0201175 A1* | 7/2014 | Ohno | G06F 16/1744 707/693 |
| 2014/0244604 A1* | 8/2014 | Oltean | H03M 7/3091 707/693 |
| 2015/0086115 A1* | 3/2015 | Danko | G06F 16/5838 382/190 |
| 2015/0301946 A1* | 10/2015 | Guo | G06F 9/45558 711/6 |
| 2016/0027145 A1* | 1/2016 | Taylor | G09G 5/393 345/555 |
| 2017/0109367 A1* | 4/2017 | Constantinescu | G06F 16/1744 |
| 2017/0214773 A1* | 7/2017 | Fan | H03M 7/607 |
| 2018/0307442 A1* | 10/2018 | Auvenshine | G06F 3/067 |
| 2019/0147067 A1* | 5/2019 | Rigor | G06F 16/172 709/217 |

* cited by examiner

*Primary Examiner* — Etienne P Leroux
*Assistant Examiner* — Farhad Agharahimi
(74) *Attorney, Agent, or Firm* — WOMBLE BOND DICKINSON (US) LLP

(57) ABSTRACT

A method, system and computer-readable storage medium for transferring data segments from one computer system to a second computing system. Prior to transfer of the data segments, the first system calculates compressibility ratio of each segment and compares the compressibility ratio to a preset threshold. Based on the comparison, the first system assigns a compressibility hint to each segment. The first system transfers the segments to the second system, together with the corresponding compressibility hint. The second system stores each segment in a compressible region or in a non-compressible region based on the hint. Then the second system compresses the compressible region and stores the compressed region in a container, and stores the non-compressible region uncompressed in the container.

20 Claims, 3 Drawing Sheets

METHOD TO OPTIMIZE INGEST IN DEDUPE SYSTEMS BY USING COMPRESSIBILITY HINTS

TECHNOLOGICAL FIELD

The present disclosure relates generally to deduplication operations, and in particular, to reducing CPU cycles during deduplication operations using compressibility hints.

BACKGROUND

In deduplication (dedupe) operation, a file is split into variable sized chunks of data, also known as segments, and these segments are deduped across multiple files in the system. The uniqueness of each segment is generally identified by segment references (seg refs) or fingerprints (hashes).

Ingesting new data includes backup applications and clients sending the whole data to the dedupe system/server (via NFS or CIFS or similar protocols), which then processes it by segmenting and fingerprinting the segments, identifying the unique and non-unique segments, and writing only the new/unique segments to the disks. The non-unique segments are simply deduped to the existing segments. The new segments are also compressed and sometimes encrypted by the deduped systems for space benefits and security reasons.

To reduce the amount of data being sent by clients to the dedupe system, the dedupe systems implement Distributed Segment Processing (DSP) in form of client libraries, which runs on the backup clients or other client systems from where the data gets ingested into the dedupe system via the client library. One example for such implementation is the Data Domain, available from Dell EMC of Hopkinton, Massachusetts, which provides the DDBoost library.

In DSP, after the client receives the new ingest data from the backup apps, it segments the data and generates fingerprints for each segment. The client then transmits the fingerprints to the dedupe server for processing. The dedupe server compares the fingerprints against a fingerprint filter, to identify the unique fingerprints that are not present in the fingerprint database, corresponding to data segments that have not been previously backed up by the server. The server then communicates back to the client which of the sent fingerprints are unique or new. The client backups the data by sending only the segments corresponding to the unique fingerprints. Once these segments are added to the backups maintained by the server, the new fingerprints are added to the fingerprint database. This helps in reducing the network I/O to a great extent as compared to data ingest via NFS/CIFS or other protocols.

When the unique segments are sent to the dedupe system to be written, the dedupe systems generally pack a group of segments into logical data regions and then compress the packed regions. If required, the systems also encrypt the packed regions. The systems write few such regions into a container object on-disk and update the fingerprint databases, indexes as needed.

As can be appreciated, the purpose of compressing the packed regions is to save on storage space. However, in some cases the data is already compressed, such as when the data is in a gzip, zip, rar, bz2, etc., format. In some other cases the data cannot be compressed further or would yield very low compression ratio, such that no or very little storage space would be saved. Thus, while the compression process is costly in terms of CPU time, it would not yield beneficial compression ratio to generate sufficient space saving. In such cases the dedupe system would unnecessarily spend CPU cycles to perform the compression—even when the data is not compressible. Moreover, the compression metadata overhead might result in more data than the uncompressed data itself. Also, when the compressed data is required to be read back, the data has to be decompressed first—again needlessly spending CPU cycles to decompress the data. Considering the vast amount of data that is ingested, the amount of already compressed data or data presenting very low compression ratio is not negligible, such that the time spent unnecessarily compressing and decompressing data with no or little benefit could be saved so as to free the CPUs for other tasks.

BRIEF DESCRIPTION OF THE DRAWING(S)

Embodiments of the invention are illustrated by way of example and not limitation in the figures of the accompanying drawings in which like references indicate similar elements. Reference will now be made to the accompanying drawings, which are not necessarily drawn to scale, and wherein.

DETAILED DESCRIPTION

Figure 1:
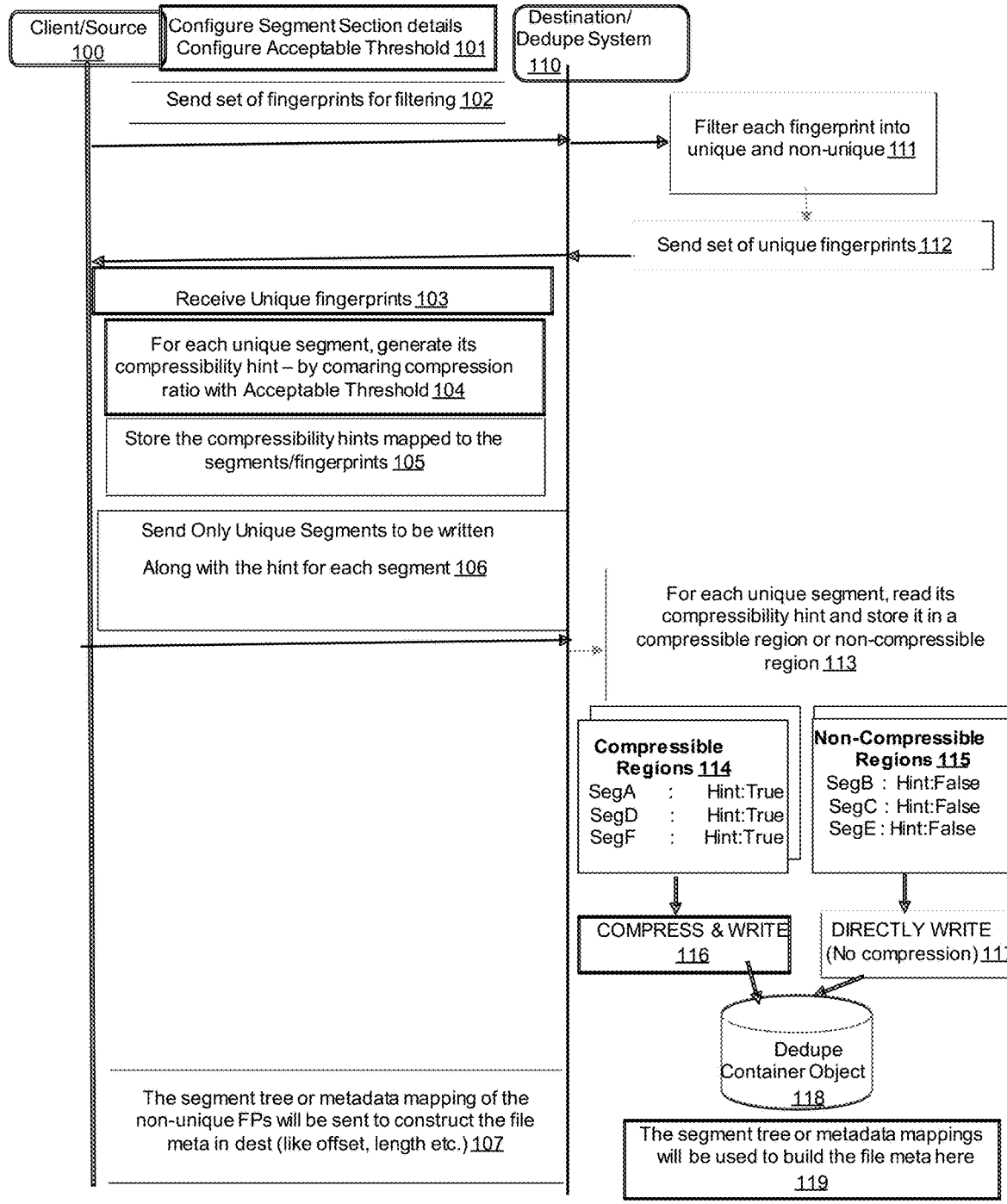
FIG. 1 illustrates a process for performing backup operations for data, according to example implementations of the present disclosure.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In some example implementations an efficient method to enhance the existing Distributed Segment Processing (DS) process is provided. Disclosed embodiments analyze the unique segments and generate compressibility hints and provide the hints to the dedupe system. The dedupe system would then decide whether to compress the segments or not based on these hints.

In some example implementations of the method the dedupe system will not have to unnecessarily spend CPU cycles on non-beneficial compressions, and it would be free to process other ongoing ingests or processes like GC (garbage collection), Data movements, recalls etc. Consequently, when reading these uncompressed regions no de-compression would be required, thus further saving CPU cycles.

In some example implementations of the method client CPU is also conserved by selective detection of compressibility.

In some example implementations of the method once the dedupe system sends back the list of unique fingerprints, the DSP client would then analyze these unique segments for their compressibility before sending them for storage. The client will analyze the unique segments to detect if they are compressible or not i.e., will compressing them result in an acceptable compression ratio. To reduce the load on the client CPU, the compression ratio will be detected by doing in-memory compression of few sections/parts (no. of sections, offset and sizes will be configurable) of each unique segment, and then comparing the sizes of the compressed output and un-compressed input. This compression ratio will be compared with a configured "acceptance threshold" and based on the result, the method will store the hint for the segment as "to be compressed" (if the ratio is equal or higher than the preset threshold) or "not to be compressed" (if the ratio is lower than the preset threshold). Upon receiving the segments, the dedupe system will utilize the hints to decide if that segment will go to a compressible region or non-compressible region. Notably, in disclosed embodiments two regions would be maintained—one containing only segments that will be compressed and another containing segments that will not be compressed. All compressible segments will be packed into the region which will be compressed at the end, while all non-compressible segments will be packed into the region which will not be compressed and will be written in uncompressed form. Each region's metadata will identify if the region is compressed or not, so that it can be used while reading the region back i.e., to decide either to decompress it or not.

It will therefore be appreciated that the above brief summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Like reference numerals refer to like elements throughout.

Example implementations of the present disclosure are generally directed to backup operations, and in particular, to backup operations deduplication, especially in implementations employing distributed segment processing.

FIG. 1 illustrates a process flow according to an embodiment. Client or source 100 operates in coordination with the destination 110, which runs a dedupe process. The process illustrated in FIG. 1 proceeds by first at step 101 configuring the segments and optionally setting a threshold for acceptable compression ratio (if a threshold was not set previously). At this point source 100 performs the standard process wherein after the client 100 receives the new ingest data from the backup application it segments the data and generates fingerprints for each segment. At step 102 the client 100 transmits the fingerprints to the dedupe server 110 for processing. At step 111 the dedupe server 110 compares the fingerprints against a fingerprint filter, to identify the unique fingerprints that are not present in the fingerprint database, corresponding to data segments that have not been previously backed up by the server 110. Then at step 112 the server 110 communicates back to the client 100 which of the sent fingerprints are unique or new.

Once the DSP client 100 receives back the list of unique segment fingerprints at 103, in step 104 the DSP client 100 would then analyze these segments at step 104 to detect if they are compressible or not i.e., will compressing them result in acceptable compression ratios. Specifically, in the embodiment illustrated in FIG. 1, in step 104 the client compress at least part of each segment and compares the resulting compression ratio with a present threshold ratio. Then client 100 stores for each segment a hint at step 105, indicating whether the compression ratio is acceptable. Then in step 106 client 100 sends only the unique segments along with their hints across to the dedupe system 110.

In step 113 the dedupe system reads the compressibility hint of each unique segment and makes a decision whether to store the segment in a compressible region 114 or non-compressible region 115. Then, in step 116 the dedupe server compresses the regions written in 114 and writes these compressed regions to dedupe container object 118, and in step 115 the dedupe server write the regions from 115 directly into the dedupe container object 118. In step 107 the mapping of the non-unique segments is sent to enable construction of the file metadata in the destination, and in step 119 the segment tree or file metadata mapping is constructed.

In one example, The DSP client would find the compression ratio of each unique segment and compare it with a pre-configured "acceptable threshold" and store that result as a hint for the segment. In one embodiment the "compressibility" hint would be a binary value or a Boolean i.e. True meaning "to be compressed" and False meaning "not to be compressed". The hint can be stored as, e.g., part of any data structure related to each segment or even in an array for a set of segments that are going to be sent to the dedupe system. However, any method enabling the client to send the hint value for each segment and for the dedupe system to be able to fetch the hint value while processing the segment is acceptable.

The disclosure now turns to examples for processes for generating compressibility hints, according to an embodiment. In disclosed examples, the process may be performed only on segments that were identified as unique. Also, in order to reduce the load on the client's CPU, the operation is performed on only a few sections or parts of the segments. According to one embodiment this will be configurable in the DSP client i.e. number of sections per segment and the {offsets and sizes} of those section, which will be selected for compression. For example, where it's sufficient for a quick test, only one section may be configured, e.g., {offset: 0, size: 1024 bytes}. According to another example, where more confidence is required on the test, two or even more than two sections can be configured, e.g., {offset:0, size: 1024 bytes} {offset:4096, size: 1024 bytes}. According to yet another example, one section with a bigger size can be configured, e.g., {offset:2048, size: 4096 bytes}. For these above examples the assumption is that average segment size is around 8 KB-12 KB. If the dedupe system has larger segments, then the configuration can be done to handle the same.

To demonstrate, the first 1024 bytes i.e. from offset 0 may be called Segment Section A, and 1024 bytes in the middle of the segment i.e. from offset 4096 may be called Segment Section B. The compression would be done using the same compression type/library as used in the dedupe system, so as to remain uniform. The compression output will not be written to disk at all. It will be purely in-memory operation. The method proceeds to find the length of the in-memory compressed output for all the sections of the segment (e.g., A and B above). The method then computes the average compression ratio for the sections. The higher the compression ratio, the better will be the space savings. Compression ratio of 1 or "nearby 1" means "Not at all compressed."

In one example, the compression ratio is computed as the ratio of the sum of the sizes of the uncompressed sections to the sum of the sizes of the compressed sections. That is: Compression ratio=$\Sigma$(size of Uncompressed Section$_i$)/$\Sigma$ (size of compressed Section$_i$) for all unique sections i=1 to n. Taking the above example of Sections A and B, if Section sizes are 1024 bytes and if compressed Sec A size=100 bytes, Sec B Size=120 bytes, then ratio will be: Compression ratio=(1024+1024)/(100+120)=2048/220=9.309. So, this is highly compressed. Conversely, If compressed Sec A size=1000 bytes, Sec B Size=900 bytes, then ratio will be: Compression ratio=(1024+1024)/(1000+900)=2048/1900=1.077. So, here it is very less compressed, almost near to no compression.

The method will then compare the compression factor with a configured "acceptance threshold." This threshold value can be configured in the DSP client and will indicate the acceptable value of the compression ratio. For example, if the threshold is configured as 3, then it would mean that, mark segment as "to be compressed" only if their compression ratio is found to be equal or greater than 3. If the calculated compression ratio of the segment is more than the configured threshold, then the segment will be marked as "to be compressed" e.g., hint:true. Otherwise, it will be marked as "not to be compressed" e.g., hint:false.

In the disclosed embodiments the compressibility test is not done at file/backup image level because of various reasons. Most of the backup applications create backup images comprising of numerous different types of files. So, the compressibility of one region might vary from the others. Also, the client is only going to send unique segments, and with a good dedupe factor, this number will be much less than the total number of segments of the file. So, its beneficial to just check the unique segments and not the whole file. Sometimes, re-compressing parts of a compressed file also tend to be beneficial. With segment level analysis, we will get benefited from that aspect as well. i.e., if the ratio is good, then it will be compressed in the dedupe system regardless of whether it is an already compressed file.

Once the method determines the compressibility of a segment, it will store that information mapped to the segment or its fingerprint as its compressibility hint. While sending the actual segments to the dedupe system, the DSP client will also send the compressibility hint for each segment either as a part of the segment data structure or an independent array mapped for the set of segments being sent or any other way depending on how the client-dedupe system interact with each other.

The dedupe system will receive the segments to be written. Traditionally, it would group a bunch of segments to one region (an in-mem buffer) and then compress the region and finally encrypt the region (if configured), before writing to an on-disk container object. According to disclosed embodiments, the dedupe system will group all segments into two separate regions. It will group all segments with the hint value as "True" i.e. "to be compressed" into one region and all the segments with the hint value as "false" i.e. "not to be compressed" into another region. Once the regions are full, it will then compress only the region containing all "compressible" segments. As usual, the region meta will identify this as a compressed region. Conversely, it will not compress the other region i.e. the one containing all the "not to be compressed" segments. Here, the region meta will not have compression related information and will therefore identify this as a non-compressed region. If encryption is required, then both these regions will be encrypted as well, before the regions are written to on-disk container objects. So, a container object might now end up having compressed and uncompressed regions of data and that would be perfectly fine for the dedupe system, as the metadata of each region identifies it as compressed or not compressed.

While reading segments, the region's metadata would indicate if it has to be decompressed or not. That is, compression headers or any other similar metadata will not be present for the region that was not compressed.

According to an optional embodiment, the compressibility check process is optimized as follows. When the DSP client receives the data to ingest, it can check the file header in the beginning itself to see if it contains matching magic header (file magic numbers) corresponding to one of the known compression types (zip, rar, gz etc.). If this file header is found to be a compressed type, then that information can solely be used to mark all segments for this file as "not to be compressed"—without the need for any segment specific compressibility checks. Note that this will only work if the header and its content match i.e. the content in the file is really compressed content as its header suggests.

According to yet another optional embodiment, the disclosed method can be executed in an analyzer mode. According to this embodiment, all the steps proceed as described above. With the exception that the dedupe system uses the hints only for accounting the benefits and not for deciding whether to compress or not in real time. The accounting will mainly be to tell how much benefits would have been received if the hints were used by the dedupe system. Necessary data structures/counters in the dedupe system will be maintained and updated when the unique segments are received by the dedupe system and compressed. For example, if the hint says not to compress, then in analyzer mode, the dedupe system will compress the region and the size difference between uncompressed and compressed regions and the time to compress can be recorded for the analytics. Later a report can be generated which would say how much time was spent for all such compressions and how much space benefits were achieved. According to yet another option, the client side "Acceptable Threshold" can be tuned based on the above results/actual benefits seen.

It should be noted that, when few incompressible segments are packed together into a region, then the compression ratio of that region (if compressed), would also be mostly very low and therefore non-beneficial when compared to the work done in compressing it. This aspect can be controlled by fine tuning the Acceptable Threshold in the client. For example, keeping a low acceptance threshold would ensure that only segments with really bad compression ratios are marked as "not to be compressed". And a region containing all such segments would also result in very low compression ratio and therefor a good candidate for "no compression".

The example provided herein are described in terms of client libraries and dedupe systems. However, the disclosed embodiments can also be applied to any algorithms and use cases that use DSP. Some examples include moving backups/files to cloud or recalling cloud data to local machine, replication to destination systems, etc. For example, the method may be applied in regular protocol (e.g., DataDomain's DDBoost protocol) for incremental backups which are taken as full or for VM (Virtual Machine) backups where multiple clients are using same VM. During replication re-sync operation, if there are no common snapshots between source and destination, the re-initialization of the whole data set needs to be done and that would involve lots of segments and destination system might spend a lot of time unnecessarily compressing incompressible segments. In file replication where multiple generations of the backups are replicated. For example, Managed File Replication in DataDomaing uses DDBoost protocol and send segs/recv of fingerprints are done there. Also, during data-movement to cloud, specifically for large files, lots of segments are sent.

Figure 2:
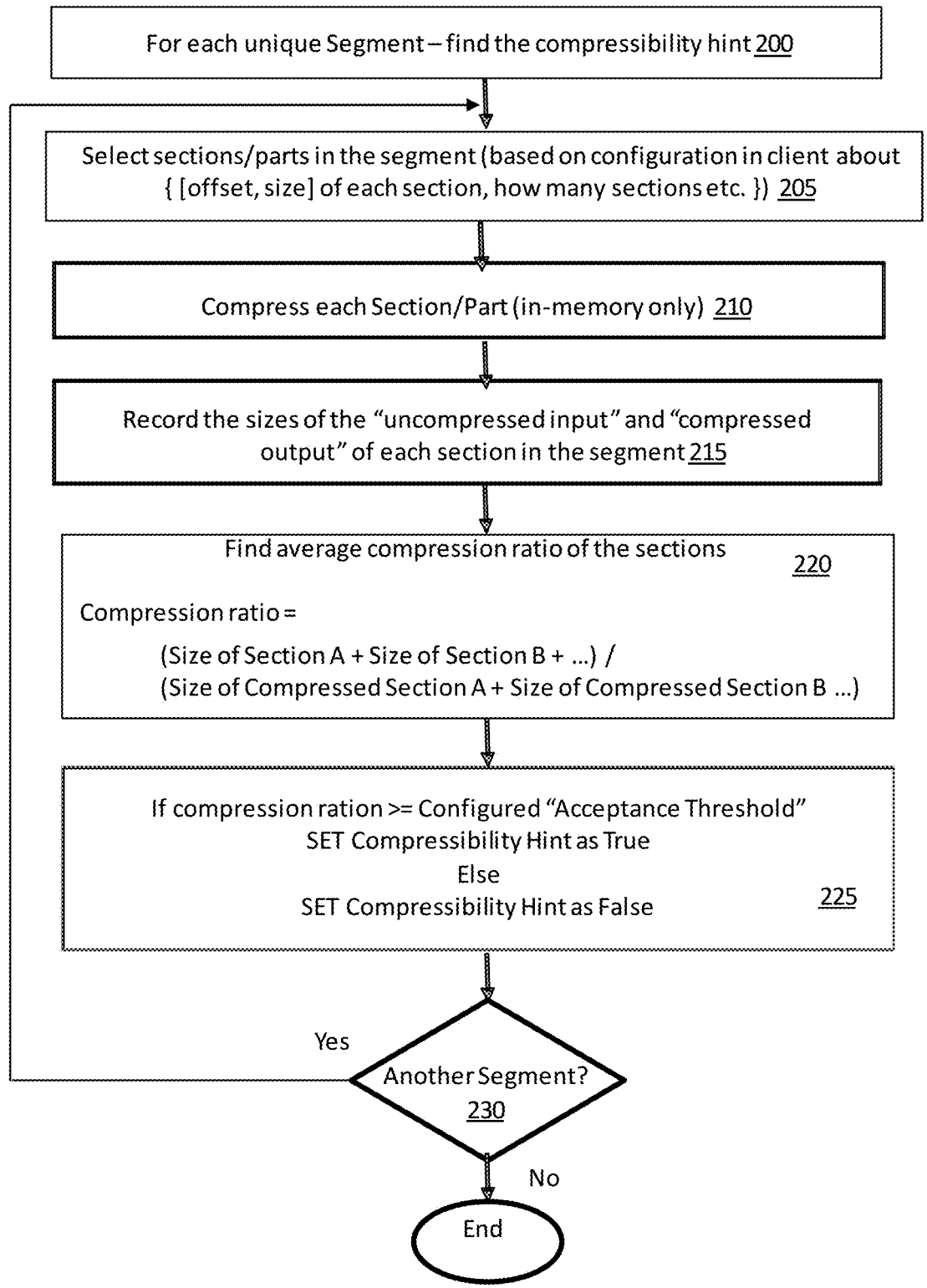
FIG. 2 illustrates generating the compressibility hint, according to example implementations of the present disclosure; and, FIG. 3 illustrates an apparatus according to example implementations of the present disclosure.

FIG. 2 illustrates one example for a process for generating a compressibility hint, according to an embodiment. At step 200 the process is initiated at the client to find the compressibility hint for each unique segment. At step 205, sections or parts of a segment are selected according to the setup of the configuration in the client, e.g., {offset,size} for each part. At step 210 the selected parts are compressed in memory only. At step 215 the sizes of the uncompressed parts and of the resulting compressed size are noted. At step 220 these sizes are used to calculate the compression ratio by summing the sizes of all the uncompressed parts and summing the sizes of all of the compressed parts and taking the ratio of the two results. At step 225 the resulting compression ratio is compared to a preset threshold and the hint is set accordingly. At step 230 it is checked whether there are more unique segments and, if so, the process reverts to step 205. Otherwise the process ends.

According to embodiments disclosed herein, the disclosed method specifically optimizes the existing dedupe algorithms using Distributed Segment Processing. In essence, whenever large number of unique segments are sent to dedupe system to be written on-disk, the method would prevent the un-necessary/non-beneficial compressions and thereby freeing up the dedupe system to a great extent to do other work. Also, many times, when un-compressible data is compressed, the output size becomes larger than the uncompressed data (due to extra meta overhead etc.). The disclosed method would also help in avoiding such outcome. For DSP scenarios, disclosed embodiments can greatly reduce the amount of processing required in the dedupe systems during backup operations.

It should also be noted that, compressing incompressible data most of the times requires more CPU cycles than compressible data. Further efficiency is achieved by the robust way to detect the compressibility of unique segments only, and that to offloaded to the DSP client, remaining along the lines of DSP. As a consequence, the embodiments would also help in improving the restore times for those segments, as now they no longer require decompression before reads. As noted, the method can also be extended to various other algorithms of the dedupe system, like data movement to cloud tier, recalls from cloud tiers, replication to destination systems, etc., where the similar fingerprint-based existence checks are done before sending unique data.

The disclosed embodiments thus provide a method of transferring data segments from a client to a storage system, comprising: for each data segment generating at the client a compressibility hint indicating whether the data segment should be compressed; sending the data segment to the storage system together with the hint; and, receiving the segment at the storage system and using the hint to determine whether to store the segment uncompressed or to compress the segment prior to storing the segment.

Disclosed embodiments also enable a computing system for performing deduplication operations of data segments of a client by a deduplication system, the system comprising a processor and a memory storing executable instructions that, in response to execution by the processor, cause the system to perform the steps comprising: generating fingerprints for all data segments; filtering the fingerprints to identify all unique data segments; for each unique data segment generating a compressibility value; sending the unique segments together with corresponding compressibility values to the deduplication system; and, store unique data segments having a first compressibility value without compression and compressing remaining unique data segments prior to storage.

Furthermore, the disclosed embodiments enable a computer-readable storage medium for transferring data segments from a first computing system to a second computing system, the computer-readable storage medium being non-transitory and having computer-readable program code stored therein that in response to execution by a processor, causes the first and second computing systems to: determine unique data segments to be transferred from the first computing system to the second computing system; assigning compressibility hint to each of the unique data segments; transferring the unique data segments together with the compressibility hints from the first computing system to the second computing system; for each of the unique segments received at the second computing system, inspecting corresponding compressibility hint; and, based on the compressibility hints compressing corresponding unique data segments and storing remaining unique data segments uncompressed.

Figure 3:
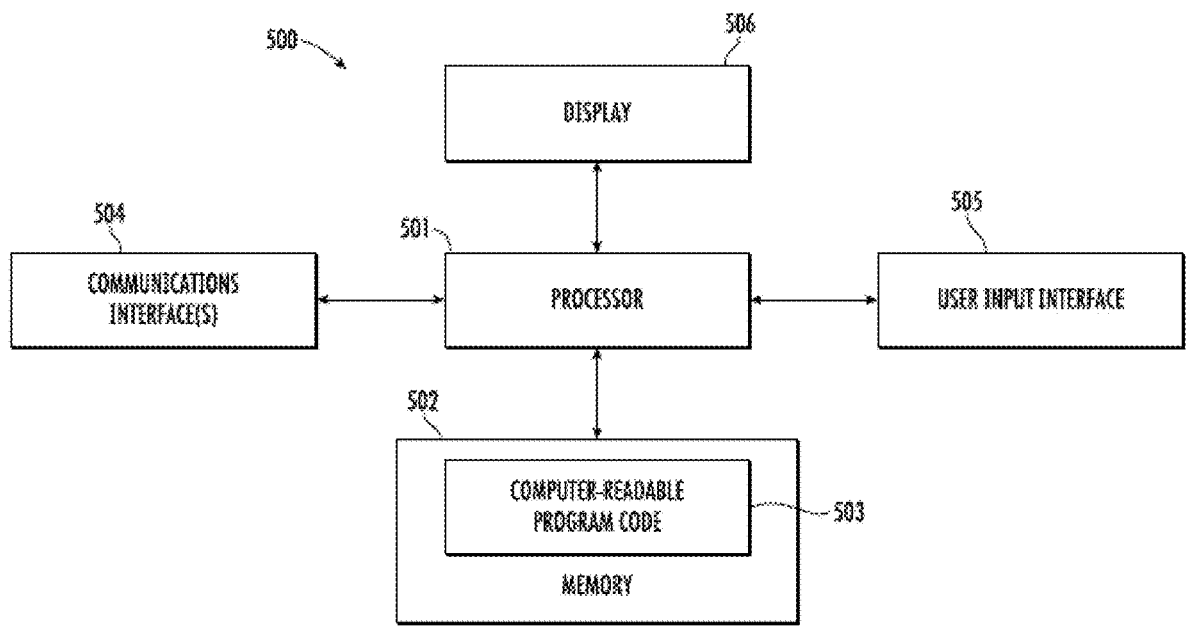

FIG. 3 illustrates an apparatus 500 according to some example implementations. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processor 501 (e.g., processing circuitry) connected to a memory 502 (e.g., storage device). In some examples, the apparatus 500 implements the system 100.

The processor 501 may be composed of one or more processors alone or in combination with one or more memories. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 502 (of the same or another apparatus).

The processor 501 may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program. In either instance, the processor may be appropriately programmed to perform functions or operations according to example implementations of the present disclosure.

The memory 502 is generally any piece of computer hardware that is capable of storing information such as, for example, data, computer programs (e.g., computer-readable program code 503) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk—read only memory (CD-ROM), compact disk—read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 502, the processor 501 may also be connected to one or more interfaces for displaying, transmitting and/or receiving information. The interfaces may include a communications interface 504 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 506 and/or one or more user input interfaces 505 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processor that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 500 may include a processor 501 and a computer-readable storage medium or memory 502 coupled to the processor, where the processor is configured to execute computer-readable program code 503 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of transferring data segments from a client to a storage system, comprising:
for an uncompressed first data segment in the data segments, generating at the client a first compressibility hint indicating whether the uncompressed first data segment should be compressed based on a threshold;
determining that the first compressibility hint indicates not to compress the uncompressed first data segment;
only in response to determining that the first compressibility hint indicates not compress the uncompressed first data segment:
compressing the uncompressed first data segment to produce a compressed first data segment;
determining a size difference between the compressed first data segment and the uncompressed first data segment;
determining an actual amount of time required to compress the uncompressed first data segment;
determining to adjust the threshold based on analyzing the size difference with the actual amount of time required to compress the uncompressed first data segment; and
adjusting the threshold based on the determining to adjust the threshold; and
sending the uncompressed first data segment to the storage system with the first compressibility hint to assist the storage system in determining whether to compress the uncompressed first data segment prior to storing the first uncompressed data segment.

2. The method of claim 1, further comprising:
generating a first ratio based on a size of the compressed first data segment and a size of the uncompressed first data segment; and
generating the first compressibility hint based on comparing the first ratio to the threshold.

3. The method of claim 2, wherein the first compressibility hint comprises a binary value corresponding to whether the first ratio surpasses the threshold.

4. The method of claim 1, further comprising:
at the storage system, storing the data segments in a compressible region or in a non-compressible region according to their corresponding compressibility hint.

5. The method of claim 4, further comprising:
compressing the compressible region and writing resulting compressed region into a container object, and directly writing the non-compressible region into the container object.

6. The method of claim 1, wherein generating the first compressibility hint comprises reading a header of a file corresponding to the uncompressed first data segment and when the header indicates a compressed format, generating the first compressibility hint to indicate the uncompressed first data segment should not be compressed.

7. The method of claim 1, further comprising:
generating a compressibility hint file that maps a unique compressibility hint for each of the data segments and transferring the compressibility hint file to the storage system.

8. The method of claim 1, further comprising:
generating a second compressibility hint indicating whether a second uncompressed data segment in the data segments should be compressed based on the adjusted threshold; and
sending the uncompressed second data segment with the second compressibility hint to the storage system.

9. A compute system for performing deduplication operations of data segments of a client by a deduplication system, the system comprising a processor and a memory storing executable instructions that, in response to execution by the processor, cause the system to:
generate fingerprints for all data segments;
filter the fingerprints to identify all uncompressed unique data segments;
for each uncompressed unique data segment, generate a compressibility value that indicates whether the uncompressed unique data segment should be compressed based on a threshold;
determine that the compressibility value indicates not to compress the uncompressed unique data segment;
only in response to determining that the compressibility value indicates to not compress the uncompressed unique data segment:
compress the uncompressed unique data segment to produce a compressed unique data segment;
determine a size difference between the compressed unique data segment and the uncompressed unique data segment;
determine an actual amount of time required to compress the uncompressed unique data segment;
determine to adjust the threshold based on analyzing the size difference with the actual amount of time required to compress the uncompressed unique data segment; and
adjust the threshold based on the determining to adjust the threshold;
send the uncompressed unique data segments together with their corresponding compressibility values to the deduplication system; and
store the uncompressed unique data segments having a compressibility value without compression and compress remaining uncompressed unique data segments prior to storage.

10. The system of claim 9, wherein the compressibility value comprises a binary value, a first compressibility value indicating an unacceptable compression ratio of a corresponding uncompressed unique data segment and a second compressibility value indicating an acceptable compression ratio of a corresponding uncompressed unique data segment.

11. The system of claim 9, wherein the compressibility value is further determined by comparing a ratio to the threshold, wherein the ratio is based on the compressing the uncompressed unique data segment.

12. The system of claim 10, wherein the compressibility value is obtained by reading a header of a file corresponding to the uncompressed unique data segment and when the header indicates a compressed format, setting the compressibility value to the first compressibility value indicating the unacceptable compression ratio of a corresponding uncompressed unique segment.

13. The system of claim 9, wherein the system further to:
generate a subsequent compressibility value indicating whether a subsequent uncompressed unique data segment should be compressed based on the adjusted threshold; and send the subsequent uncompressed unique data segment with the subsequent compressibility value to the deduplication system.

14. A computer-readable storage medium for transferring data segments from a first computing system to a second computing system, the computer-readable storage medium being non-transitory and having computer-readable program code stored therein that in response to execution by a processor, causes the first and second computing systems to:

determine uncompressed unique data segments to be transferred from the first computing system to the second computing system;

assign a compressibility hint to each of the uncompressed unique data segments that indicates whether each of the uncompressed unique data segments should be compressed based on a threshold;

determine that one of the compressibility hints indicates to not compress one of the uncompressed unique data segments;

only in response to determining that one of the compressibility hints indicates to not compress one of the uncompressed unique data segments:

compress the uncompressed unique data segment to produce a compressed unique data segment;

determine a size difference between the compressed unique data segment and the uncompressed unique data segment;

determine an actual amount of time required to compress the uncompressed unique data segment;

determine to adjust the threshold based on analyzing the size difference with the actual amount of time required to compress the uncompressed unique data segment; and adjust the threshold based on the determining to adjust the threshold;

transfer the uncompressed unique data segments together with the compressibility hints from the first computing system to the second computing system;

for each of the uncompressed unique data segments received at the second computing system, inspect their corresponding compressibility hint; and based on the compressibility hints, compress corresponding uncompressed unique data segments and store remaining uncompressed unique data segments uncompressed.

15. The computer-readable storage medium of claim 14, wherein the assigning of the compressibility hints comprises determining a compressibility ratio for each of the uncompressed unique data segments and comparing the compressibility ratio to the threshold.

16. The computer-readable storage medium of claim 15, wherein determining the compressibility ratio comprises calculating a compressibility ratio based on an uncompressed size of the uncompressed unique data segment and a compressed size of the compressed unique data segment.

17. The computer-readable storage medium of claim 14, wherein the compressibility hint comprises a binary value.

18. The computer-readable storage medium of claim 17, wherein the second computing system stores all uncompressed unique data segments having the compressibility hint of a first binary value in a first region and stores all uncompressed unique data segments having the compressibility hint of a second binary value in a second region.

19. The computer-readable storage medium of claim 18, wherein the second computing system further compresses the first region and stores resulting compressed region in a container object and stores the second region in the container object uncompressed.

20. The computer-readable storage medium of claim 14, wherein the first system further to:

generate a subsequent compressibility hint indicating whether a subsequent uncompressed unique data segment should be compressed based on the adjusted threshold; and transfer the subsequent uncompressed unique data segment with the subsequent compressibility hint to the second computing system.

\* \* \* \* \*